(12) United States Patent
Ishii et al.

(10) Patent No.: US 7,256,994 B2
(45) Date of Patent: Aug. 14, 2007

(54) POWER SUPPLY APPARATUS

(75) Inventors: Hideo Ishii, Osaka (JP); Masao Katooka, Osaka (JP); Kazunori Nakata, Osaka (JP); Takeshi Morimoto, Osaka (JP); Yuji Ikejiri, Osaka (JP)

(73) Assignee: Sansha Electric Manufacturing Company, Limited, Osaki-Shi (JP)

( * ) Notice: Subject to any disclaimer, the term of this patent is extended or adjusted under 35 U.S.C. 154(b) by 33 days.

(21) Appl. No.: 11/250,949

(22) Filed: Oct. 14, 2005

(65) Prior Publication Data

US 2007/0086159 A1 Apr. 19, 2007

(51) Int. Cl.
*H05K 7/20* (2006.01)
(52) U.S. Cl. .................................... 361/690
(58) Field of Classification Search ................ 361/690, 361/709, 807–811, 600, 715, 694–695, 725–728
See application file for complete search history.

(56) References Cited

U.S. PATENT DOCUMENTS 5,497,289 A * 3/1996 Sugishima et al. ......... 361/709
6,341,063 B2 * 1/2002 Kinoshita et al. .......... 361/690
6,678,157 B1 * 1/2004 Bestwick ................... 361/695
2005/0068728 A1 * 3/2005 Chu et al. .................. 361/690

FOREIGN PATENT DOCUMENTS

JP        2003-136241        5/2003

* cited by examiner

*Primary Examiner*—J. F. Duverne
(74) *Attorney, Agent, or Firm*—Duane Morris LLP

(57) ABSTRACT

An opening is formed in a case. Air is caused to flow through the interior of the case. A panel closes the opening. A printed circuit board is disposed behind the panel within the case. A plurality of components, including a control device which can be operated on the front surface of the panel and a display device providing a display viewable on the front surface of the panel, are mounted on the printed circuit board. The printed circuit board is enclosed in a closed receptacle disposed within the case.

5 Claims, 3 Drawing Sheets

POWER SUPPLY APPARATUS

This invention relates to a power supply apparatus and, more particularly, to an arrangement of printed circuit boards used in the power supply apparatus.

BACKGROUND OF THE INVENTION

A power supply apparatus, e.g. a power supply apparatus for a welder, may have a control panel on its outer surface. An example of a power supply apparatus with such control panel is disclosed in Japanese Patent Application Publication No. 2003-136241 (JP 2003-136241 A). The power supply apparatus disclosed in JP 2003-136241 A includes a control panel on an outer surface of a case, and the control panel includes setting devices for setting currents and voltages the power supply apparatus may supply, switches for selecting operating modes of the apparatus, and indicator lamps indicating the operating states. Also not explicitly stated in the publication, the setting devices, the switches and the lamps are mounted on a printed circuit board. This printed circuit board may be packed with high density. In such case, the distance between printed conductors on the circuit board is very small, e.g. less than 0.5 mm. The densely packed printed circuit board is fixed to the rear, or inside surface of the control panel. Plural openings are formed through the control panel, through which controls for the setting devices and switches and the indicator lamps are exposed to enable an operator to externally operate the setting devices and switches and to confirm the operating states by means of the indications by the lamps.

Frequently, in order to cool the interior of the case of the power supply apparatus, outside air is taken into the case, and, in such case, both of opposing major surfaces of the densely packed printed circuit board for the control panel is exposed to the air taken into the case.

A power supply apparatus for a welder is sometimes used in an environment where electrically conductive dust and/or corrosive gas are present. Such conductive dust and corrosive gas will enter into the case of the power supply apparatus and adversely affect printed circuit boards inside the case. In particular, the printed circuit board for the control panel is affected by dust and corrosive gas more than other printed circuit boards, because it is more densely packed. Electrically conductive dust sticking to the printed circuit board degrades insulation of the circuit board, and corrosive gas corrodes components mounted on the circuit board and printed conductors, which would cause malfunction of the power supply apparatus.

Therefore, an object of the present invention is to protect a printed circuit board for a control panel from surrounding air to avoid influence of the air on the printed circuit board.

SUMMARY OF THE INVENTION

According to one aspect of the present invention, a power supply apparatus includes a case through the interior of which air can flow. In order to make air flow through the interior of the case, an air intake port and an air outlet port may be desirably formed in the case at different parts thereof. It is also desirable to dispose a fan within the case to help air flow through the interior of the case. An opening is formed in the case and is closed by a panel. The panel can cover the opening from inside the case or from outside the case. A first printed circuit board is disposed within the case behind the panel. A plurality of components are mounted on the first printed circuit board. The components include a control device operable on the front side of the panel, and a display device providing a display viewable on the front-side of the panel. The control device has a controller to be used for operating the control device, which desirably extends outward through the panel. The display device has its display desirably appearing on the front side of the panel. The first printed circuit board is housed in a closed receptacle within the case.

With the above-described structure of the power supply apparatus, the first printed circuit board does not contact with electrically conductive dust and/or corrosive gas which could be contained in the air flowing through the interior of the case because the first printed circuit board is placed in the closed receptacle. Accordingly, it occurs neither that the insulation of the first printed circuit board degrades, nor that the components mounted on the first printed circuit board or the printed conductors could be corroded.

The distance between adjacent ones of a plurality of conductors printed on the first printed circuit board may be small. If any electrically conductive dust adheres to the printed circuit board with conductors spaced from each other by a small distance, it tends to degrade the insulation between the conductors. However, according to the invention, the first printed circuit board is housed in a closed receptacle, degradation of the insulation of the first printed circuit board does not occur.

It is desirable that the receptacle should include a wall unit extending inward into the interior of the case from the inner surface of the panel and having an opening in its distal, or innermost, end, and a lid closing the opening. It is desirable that the wall unit and the panel are formed integral. Since the wall unit is formed on the panel, the end of the wall unit on the panel side is closed by the panel, and, therefore, no extra member is required to close that end, which makes the structure of the power supply apparatus simple.

The lid closing the rear opening formed by the wall unit may be a second printed circuit board. This eliminates the need to prepare a lid for dedicated use, so that the structure of the power supply apparatus can be simple.

The first printed circuit board may be disposed in close proximity to the rear or inner surface of the panel. A securing member for securing the first printed circuit board is disposed on the inner surface of the wall unit, and the securing member desirably extends inward of the outer peripheral edges of the rear surface of the first printed circuit board. This arrangement eliminates the need for use of screws or adhesive for securing the first printed circuit board, which makes it easier to manufacture the power supply apparatuses.

DESCRIPTION OF PREFERRED EMBODIMENTS

Figure 1:
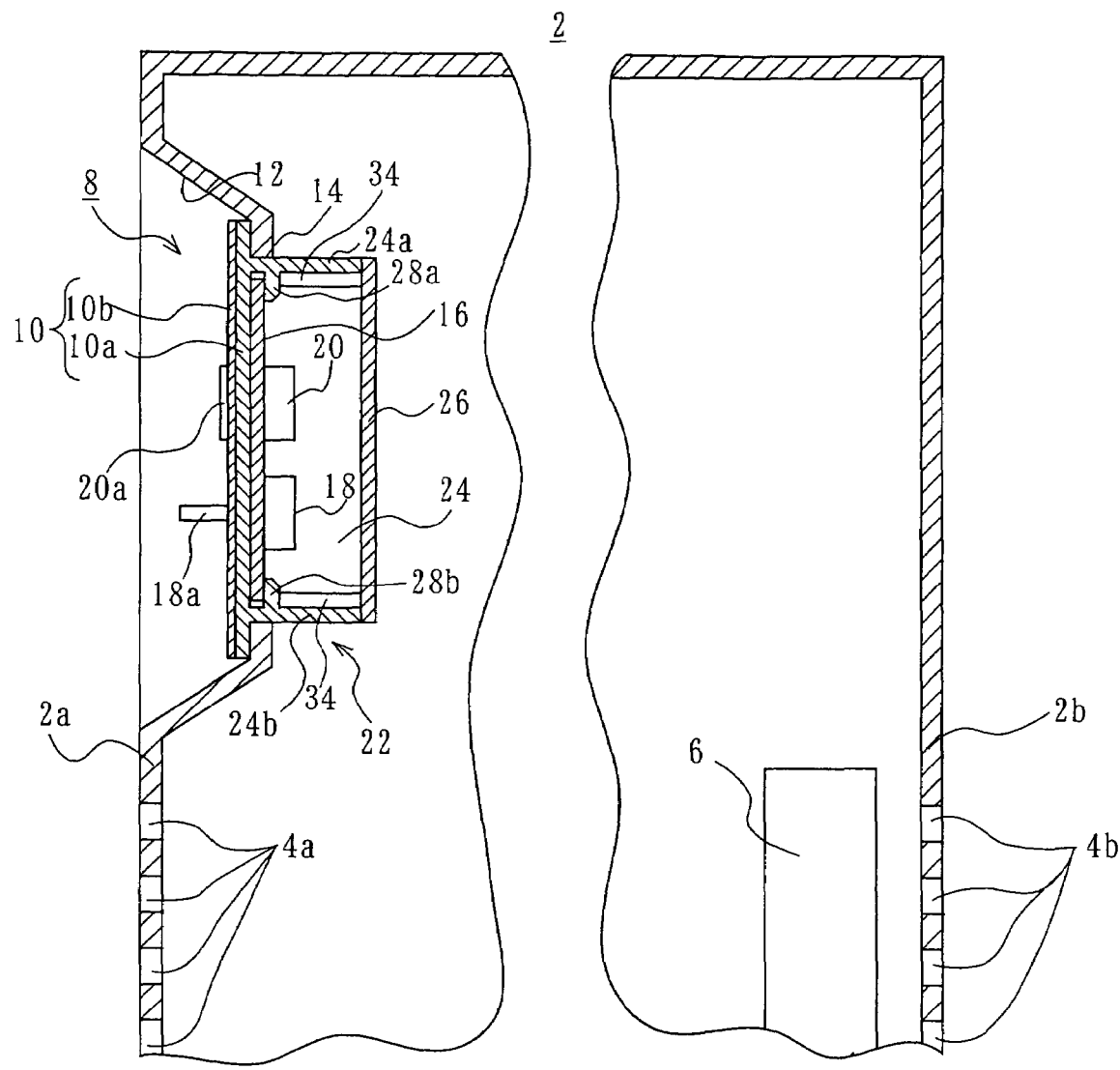
FIG. 1 is a partially broken-away, longitudinal cross-sectional view of a power supply apparatus according to one embodiment of the present invention.
Figure 2:
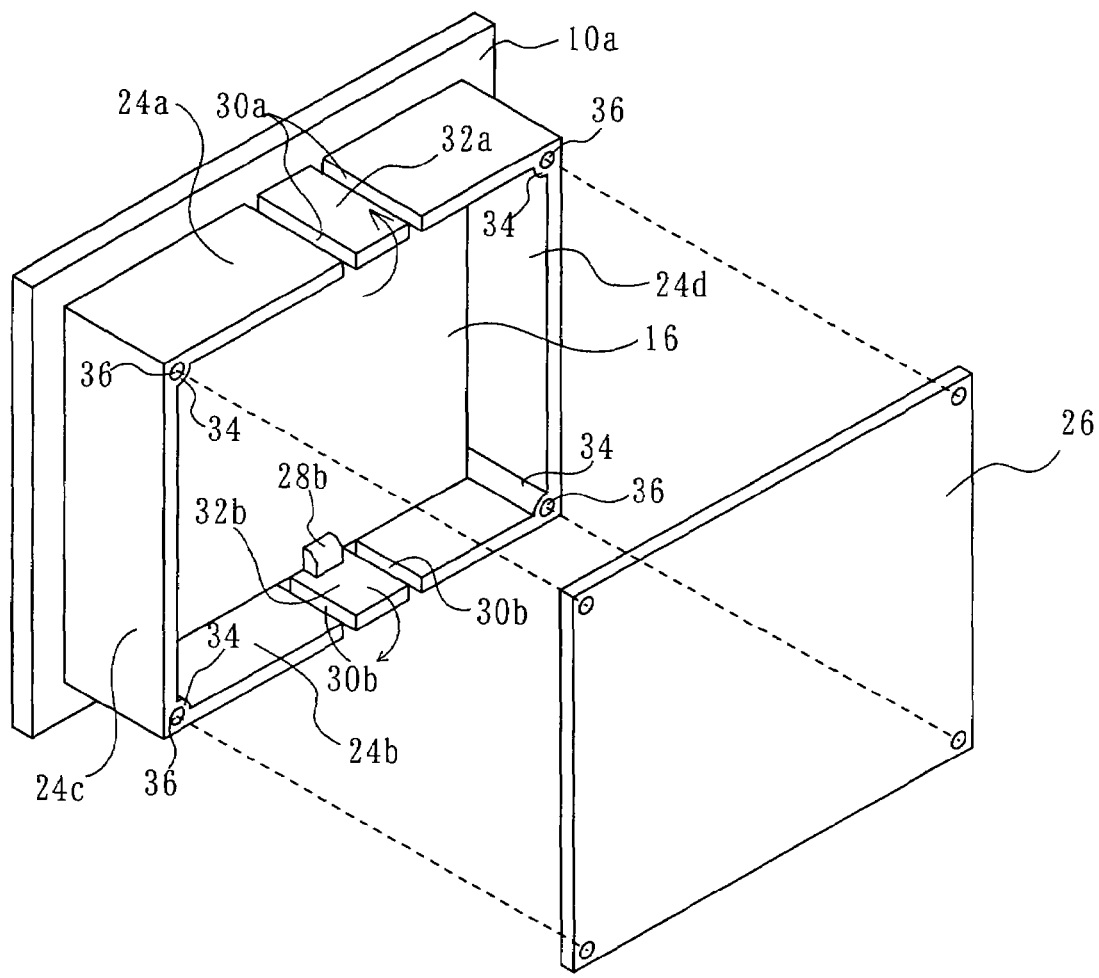
FIG. 2 is an exploded view of a control panel of the power supply apparatus shown in FIG. 1.

A power supply apparatus for welding according to one embodiment of the present invention is shown in FIGS. 1 and 2. As is seen from FIG. 1, the power supply apparatus has a case 12, which may be made of, for example, synthetic resin and houses a power supply circuit, e.g. a power supply circuit for a welder (not shown). In order to cool down components of the power supply circuit generating a large amount of heat, external air is introduced into the case 2. The introduced air flows through the interior of the case 2 and is discharged. For this purpose, a plurality of air intake openings 4a are formed in a front panel 2a of the case 2, and a plurality of air discharge openings 4b are formed in a rear panel 2b, which faces the front panel 2a with a spacing disposed therebetween. In order to help air to be taken in and discharged, a blower 6 is disposed near the rear panel 2b within the case 2. Power supply apparatuses for welding may be used in an environment where electrically conductive dust and/or corrosive gas exist. Such conductive dust or corrosive gas tends to enter into the case 2 through the air intake openings 4a.

On the case 2, a control and display unit 8 is mounted, which is used to set various parameters for operation of the power supply apparatus and to display operating states of the power supply apparatus to enable an operator to know the current operating state. The control and display unit 8 includes a control panel 10, which closes an opening 14 in the bottom of a recessed portion 12 formed in an upper part of the front panel 2a. The control panel 10 closes the front of the opening 14. In other words, the outer peripheral portion of the control panel 10 overlies the front surface of the portion of the front panel 2a around the opening 14. The opening 14 is rectangular, for example, and the control panel 10 is also rectangular and is slightly larger than the opening 14. The control panel 10 is formed of a planar plate 10a, which may be formed of synthetic resin, for example, and a display sheet 10b bonded to the front surface of the plate 10a.

A printed circuit board 16, for example, a printed circuit board for the control panel, is disposed on the inner surface of the plate 10a inside the case 2. The control panel printed circuit board 16 has a rectangular shape and is in contact with the plate 10a. A plurality of conductors are printed on the circuit board 16 with a small spacing of, for example, less than 5 mm, disposed between adjacent conductors.

Also, plural components are mounted on the printed circuit board 16 for the control panel. The components on the printed circuit board 16 include control devices 18, for example, rotary encoders and switches for setting operating conditions of the power supply apparatus. A display device 20 is also mounted on the printed circuit board 16, for displaying the operating state of the apparatus. At least one of the control devices 18 has a controller 18a which enables an operator to operate the control device 18 from outside the case 2. The controller 18a extends outward into the recessed portion 12 through openings (not shown) formed in the plate 10a and the display sheet 10b. The display device 20 has a display section 20a displaying the operating state of the power supply apparatus. The display section 20a extends outward into the recessed portion 12 through openings (not shown) in the plate 10a and the display sheet 10b.

The control panel printed circuit board 16 is enclosed in a receptacle 22. As shown in FIG. 2, the receptacle 22 has a wall unit 24, which is in the shape of a hollow, short, rectangular prism, extending generally perpendicularly from the inner surface of the plate 10a into the case 2. The wall unit 24 is formed of a synthetic resin and is formed integral with the plate 10a. The wall unit 24 has longer-side walls 24a and 24b in parallel with each other, and also shorter-side walls 24c and 24d extending in parallel with each other and perpendicular to the longer-side walls 24a and 24b. The longer-side and shorter-side walls 24a-24d are disposed in proximity to the peripheral edges of the control panel printed circuit board 16. The wall unit 24 has an opening at its innermost end.

The opening of the wall unit 24 is closed with a lid. Another printed circuit board 26 is used as the lid in the illustrated embodiment. Part of the power supply circuit is arranged on the printed circuit board 26. The shape of the printed circuit board 26 is substantially the same as that of the rear opening in the wall unit 24. The receptacle 22, thus, is formed by the wall unit 24 and the printed circuit board 26.

The control panel printed circuit board 16 is secured to the plate 10a by means of securing members 28a and 28b formed on the inner surfaces of the longer-side walls 24a and 24b. The securing members 28a and 28b are integral with the wall unit 24 and located at the midpoints of the longer-side walls 24a and 24b, respectively. The securing members 28a and 28b extend over part of the inner, or rear, surface of the printed circuit board 16 so as to press the board 16 against the plate 10a.

Slits 30a and 30b are formed in the longer-side walls 24a and 24b at locations on the opposite sides of the respective securing members 28a and 28b, so that tongue-like pieces 32a and 32b are formed, with the securing members 28a and 28b formed thereon, respectively. For mounting the control panel printed circuit board 16, the board 16 is first placed inside the wall unit 24 through the opening in the innermost end of the wall unit 24, and bend the tongue-like pieces 32a and 32b outward as indicated by arrows in FIG. 2 so that the securing members 28a and 28b are also displaced outward. With the tongue-like pieces 32a and 32b kept in this position, the printed circuit board 16 is moved over the thus displaced securing members 28a and 28b onto the inner surface of the plate 10a. Thereafter, the tongue-like pieces 32a and 32b are released, which causes the securing members 28a and 28b to return to their original positions shown in FIG. 1 where they are in contact with the rear surface of the control panel printed circuit board 16 and urge the printed circuit board 16 against the plate 10a.

Screws (not shown) are used to fix the printed circuit board 26 to the wall unit 24. For that purpose, ribs 34 are formed at the four inner corners of the wall unit 24. The ribs 34 extend across the entire width of the wall unit 24 between the rear surface of the plate 10a and the rear end opening in the wall unit 24. Screw holes are formed in the rear end surfaces of the respective ribs 34, into which screws (not shown) are screwed through screw holes 38 formed in the four corners of the printed circuit board 26, to thereby mount the printed circuit board 26 to close the opening in the wall unit 24.

With the above-described arrangement, the printed circuit board 16 for the control panel is placed in the receptacle 22 formed by the wall unit 24 and the printed circuit board 26. Accordingly, if the air taken into the case 2 through the intake openings 4a contains electrically conductive dust and/or corrosive gas, the printed circuit board 16 is shielded from and does not contact with such dust and/or corrosive gas. The spacing between adjacent ones of the printed conductors on the printed circuit board 16 is small, and, therefore, if electrically conductive dust adheres to the printed circuit board 16, insulation between adjacent conductors is degraded. However, with the above-described arrangement, such insulation degradation can be suppressed. Also, since the control devices 18 and the display device 20 do not directly contact corrosive gas, if any, in the cooling air, they are hardly corroded.

Since the wall unit 24 of the receptacle 22 is formed integral with the plate 10a which is part of the control panel 10, with the printed circuit board 26, which is part of the power supply circuit, used also as the lid to close the rear opening of the wall unit, the power supply apparatus according to this invention is easy to manufacture. Furthermore, the securing members 28a and 28b for securing the printed circuit board 16 in the receptacle 22 are formed integral with the wall unit 24, there is no need to use any screws to fix the printed circuit board 16.

Figure 3:
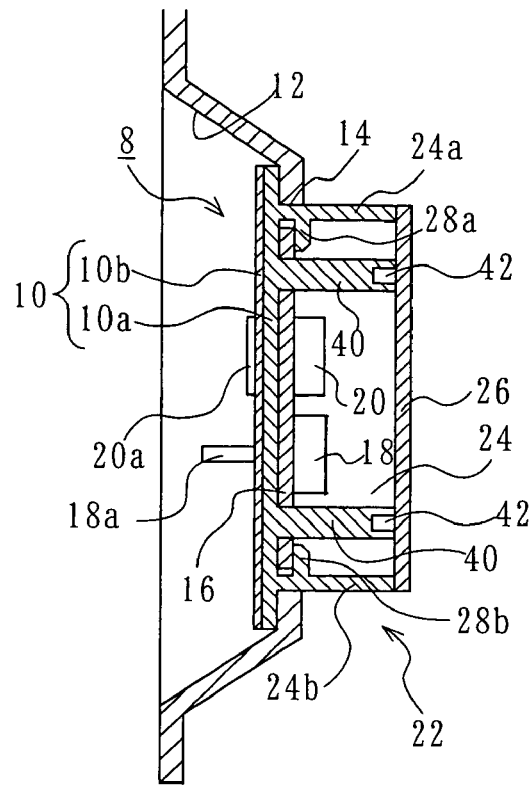
FIG. 3 is a partially broken-away, cross-sectional view of a power supply apparatus according to another embodiment of the present invention.

Part of a power supply apparatus according to a second embodiment of the present invention is shown in FIG. 3. The power supply apparatus according to the second embodiment differs from the apparatus according to the first embodiment in the manner of fixing the printed circuit board 26. Since the remainder is the same as the power supply apparatus shown in FIGS. 1 and 2, the same reference numerals are used for the same or similar parts and components, and no further description is given about them. Spacers 40 are formed integral with the plate 10a at spaced locations on the rear surface of the plate 10a. The spacers 40 extend through the control panel printed circuit board 16 to the rear opening of the wall unit 24. Screw holes 42 are formed in the rear end surfaces of the spacers 40, and screws (not shown) are screwed through the printed circuit board 26 into the screw holes 42, so that the printed circuit board 26 is fixed to the wall unit 24 and closes the rear opening of the wall unit 24.

Figure 4:
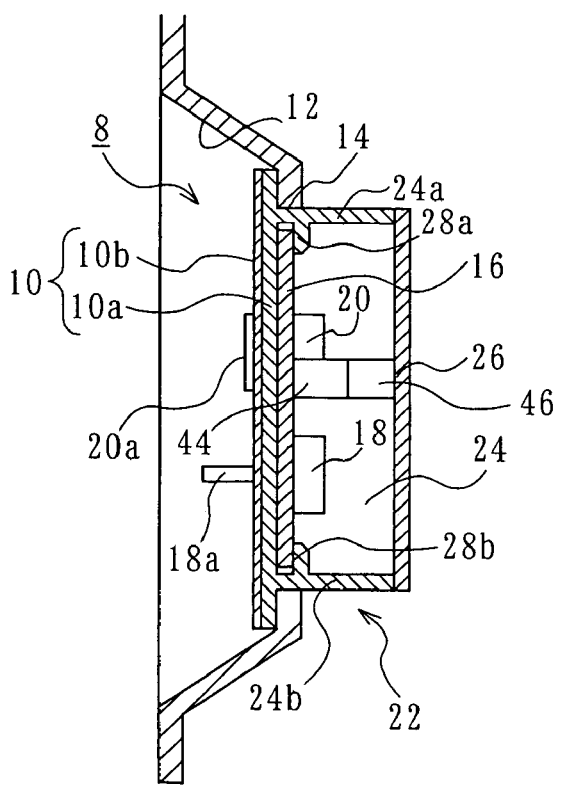
FIG. 4 is a partially broken-away, cross-sectional view of a power supply apparatus according to still another embodiment of the present invention.

Part of a power supply apparatus according to a third embodiment is shown in FIG. 4 The power supply apparatus shown in FIG. 4 differs from the one shown in FIGS. 1 and 2 in the manner of fixing the printed circuit board 26. Since the remainder is the same as the apparatus shown in FIGS. 1 and 2, the same reference numerals are used for the same or similar parts and components and no detailed description is given about them. The printed circuit board 26 according to this embodiment is electrically connected to the printed circuit board 16 for the control panel. For that purpose, a connector 44 is mounted on the printed circuit board 16 and a connector 46 is mounted on the printed circuit board 26. The lengths of the connectors 44 and 46 are so determined that, when they are connected together, the printed circuit board 26 can be located at the rear opening of the wall unit 24 to thereby close the rear opening.

In the above-described embodiments, the printed circuit board 26 is used as a lid for closing the rear opening of the wall unit 24, but any one of various suitable members may be used instead. For example, a plate for mounting components of the power supply apparatus can be used. Also, in the embodiments described above, the shape of the wall unit 24 is a hollow-short rectangular prism so as to conform with the rectangular shape of the printed circuit board 16, but, if the shape of the printed circuit board 16 is different, for example, circular, the wall unit may have a cylindrical shape. The securing members 28a and 28b may be formed on the shorter-side walls 24c and 24d instead of the longer-side walls 24a and 24b.

What is claimed is:

1. A power supply apparatus comprising:
    a case having a front panel, and a rear panel disposed to face said front panel with a spacing disposed therebetween, said front panel having therein a plurality of air intake openings and a first opening spaced from said air intake openings, said first opening being larger than said air intake openings, said rear panel having a plurality of air discharge openings facing said plurality of air intake openings;
    a blower disposed within said case for introducing air through said air intake openings into said case and discharging the introduced air through said air discharge openings;
    a control panel disposed to close said first opening;
    a first printed circuit board disposed at a location within said case corresponding to the location of said first opening; and
    a plurality of components mounted on said first printed circuit board, including a control device which can be operated from outside said case, and a display device providing a display viewable from outside said case; and
    a closed receptacle disposed within said case, said receptacle extending from a periphery of said first opening further into said case and enclosing said first printed circuit board therein.

2. The power supply apparatus according to claim 1 wherein a distance between adjacent ones of printed conductors printed on said first printed circuit board is small.

3. The power supply apparatus according to claim 1 wherein said receptacle comprises a wall unit extending from a surface of said control panel facing inward of said case into the interior of said case and having a second opening at an inner end thereof, and a lid closing said second opening.

4. The power supply apparatus according to claim 3 wherein said lid is a second printed circuit board separate from said first printed circuit board.

5. The power supply apparatus according to claim 3 wherein said first printed circuit board is located adjacent to the surface of said control panel facing inward of said case, and a securing member for securing said first printed circuit board is disposed on an inner surface of said wall unit.

\* \* \* \* \*